(12) United States Patent
Chang

(10) Patent No.: US 6,261,907 B1
(45) Date of Patent: Jul. 17, 2001

(54) METHOD OF FORMING A FLASH EEPROM DEVICE BY EMPLOYING POLYSILICON SIDEWALL SPACER AS AN ERASE GATE

(76) Inventor: Ming-Bing Chang, 2139 Stebbins Ave., Santa Clara, CA (US) 95051

( * ) Notice: Subject to any disclaimer, the term of this patent is extended or adjusted under 35 U.S.C. 154(b) by 0 days.

(21) Appl. No.: 09/453,395

(22) Filed: Dec. 3, 1999

Related U.S. Application Data

(62) Division of application No. 09/060,673, filed on Apr. 15, 1998, now Pat. No. 6,043,530.

(51) Int. Cl.⁷ ................................................. H01L 21/336
(52) U.S. Cl. ......................... 438/266; 438/257; 438/258; 438/267
(58) Field of Search ..................... 438/257, 258, 438/262, 263, 264, 265, 266, 267, 279

(56) References Cited

U.S. PATENT DOCUMENTS

| | | | | |
|---|---|---|---|---|
| 5,438,542 | * | 8/1995 | Atsumi et al. | 365/182 |
| 5,455,792 | * | 10/1995 | Yi | 365/185.12 |
| 5,686,332 | * | 11/1997 | Hong | 438/266 |
| 5,712,179 | * | 1/1998 | Yuan | 438/266 |
| 5,838,039 | * | 11/1998 | Sato et al. | 257/321 |
| 6,043,530 | | 3/2000 | Chang | 257/320 |
| 6,101,131 | * | 8/2000 | Chang | 365/185.33 |
| 6,125,060 | * | 9/2000 | Chang | 365/185.29 |

* cited by examiner

*Primary Examiner*—Charles Bowers
*Assistant Examiner*—Jack Chen

(57) ABSTRACT

A Flash EEPROM cell employing a sidewall polysilicon spacer as an erase gate. The cell is programmed by source side channel hot electron injection and erased by poly-to-poly tunneling through a poly tunnel oxide between the floating gate and the erase gate. The floating gate is defined by the control gate sidewall spacer which is formed before the floating gate poly self-aligned etch step. The polysilicon sidewall spacer erase gate is formed after growing a poly tunnel oxide on the sidewall of the floating gate poly. Since the poly tunnel oxide thickness is minimized, a fast programming with a low power consumption can be achieved. By using poly-to-poly tunneling erase scheme, a deep source junction is not used and cell size can be significantly reduced. Furthermore, a large sector of cells can be erased simultaneously without a power consumption concern and further $V_{cc}$ scaling becomes possible.

1 Claim, 10 Drawing Sheets

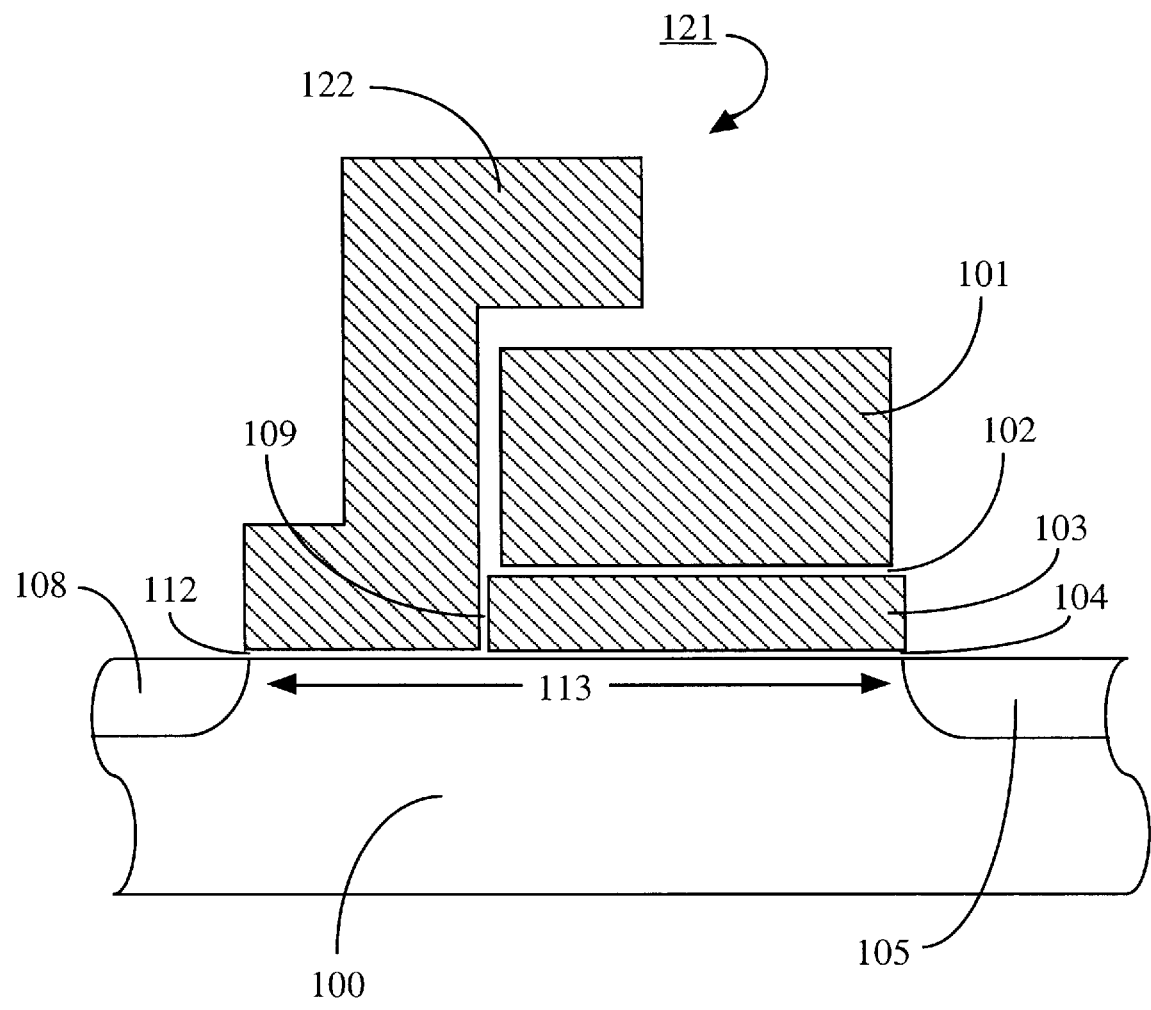
FIG._ 1e

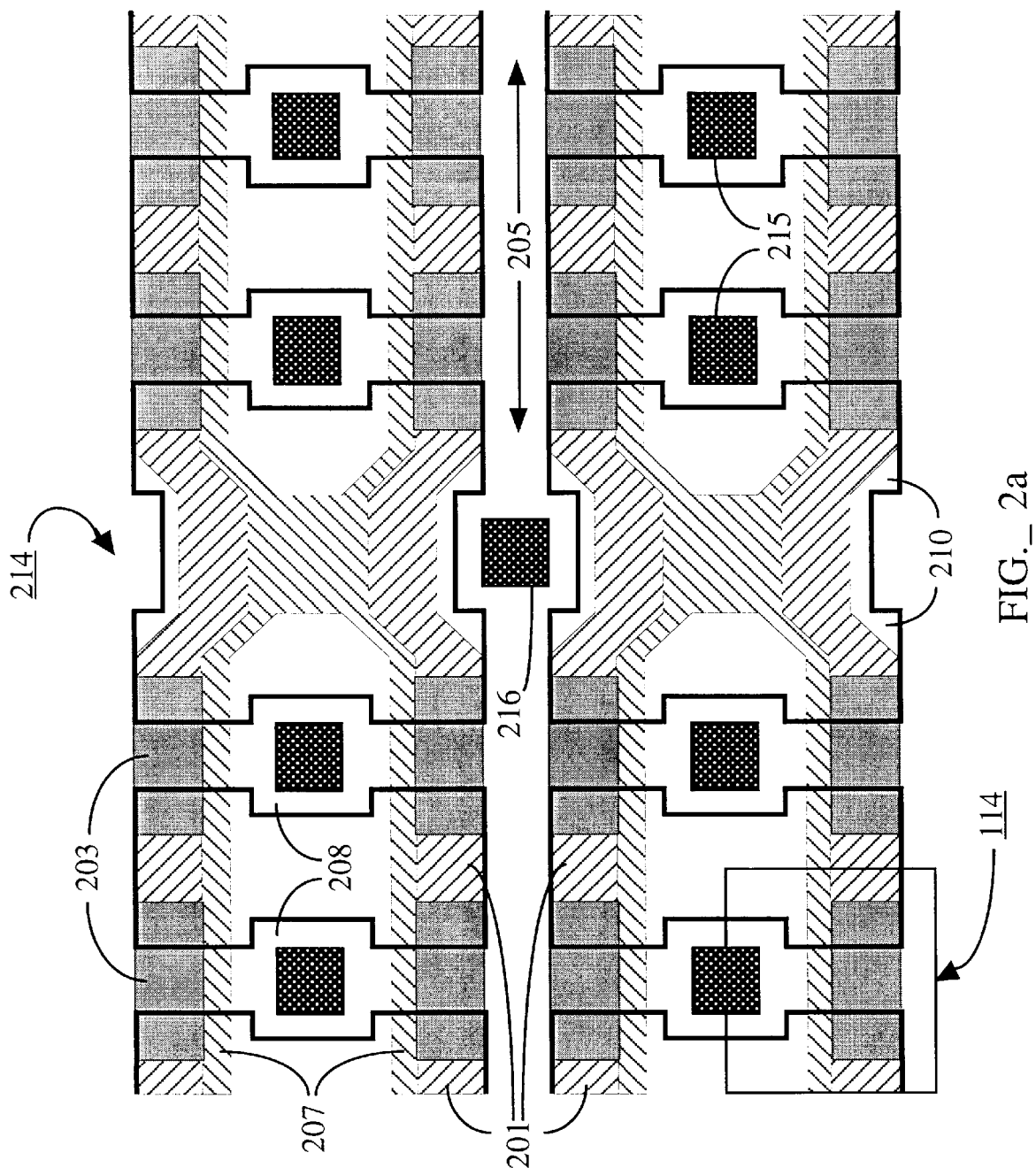
FIG._ 2a

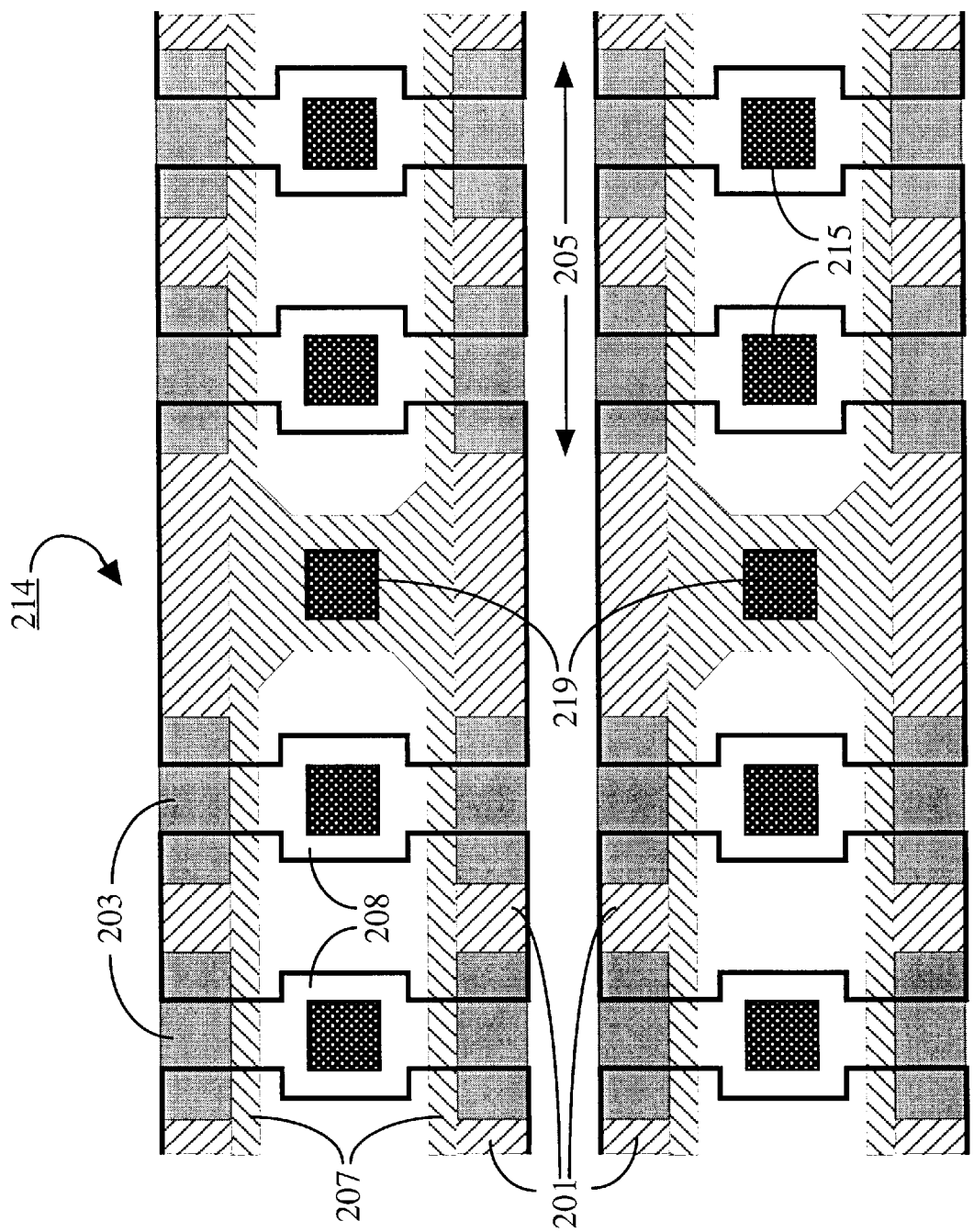
FIG._2b

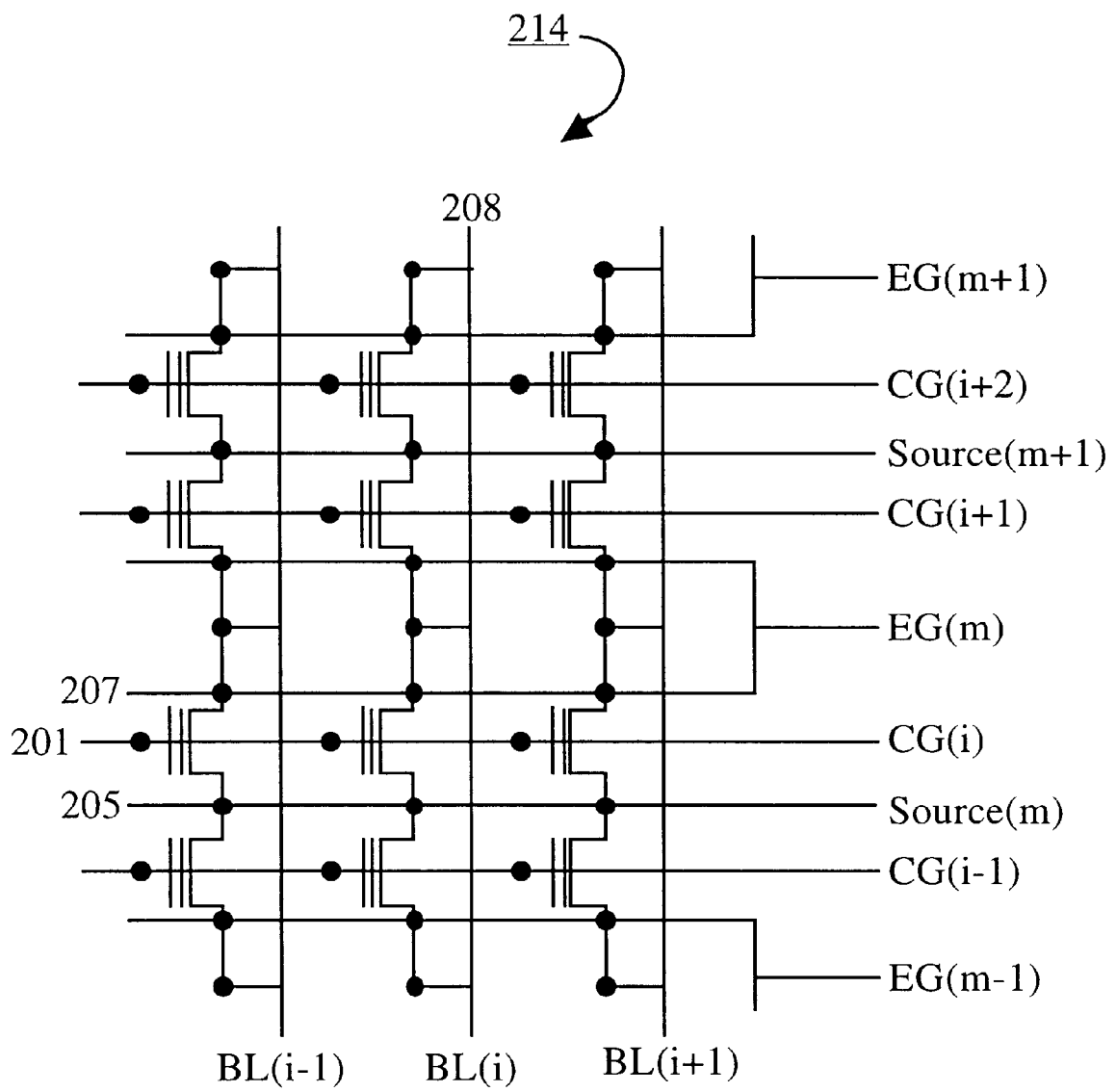
FIG._3

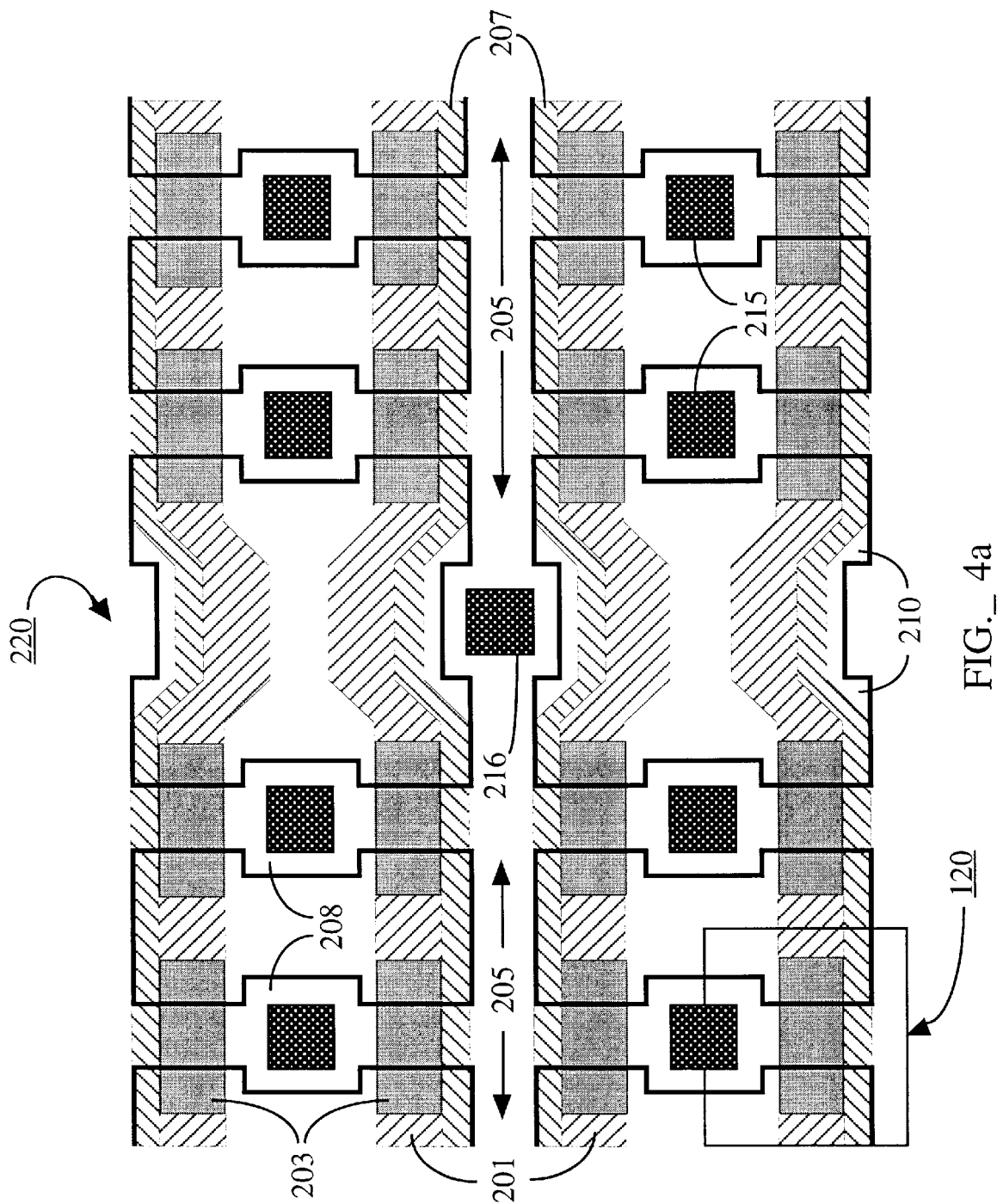
FIG._4a

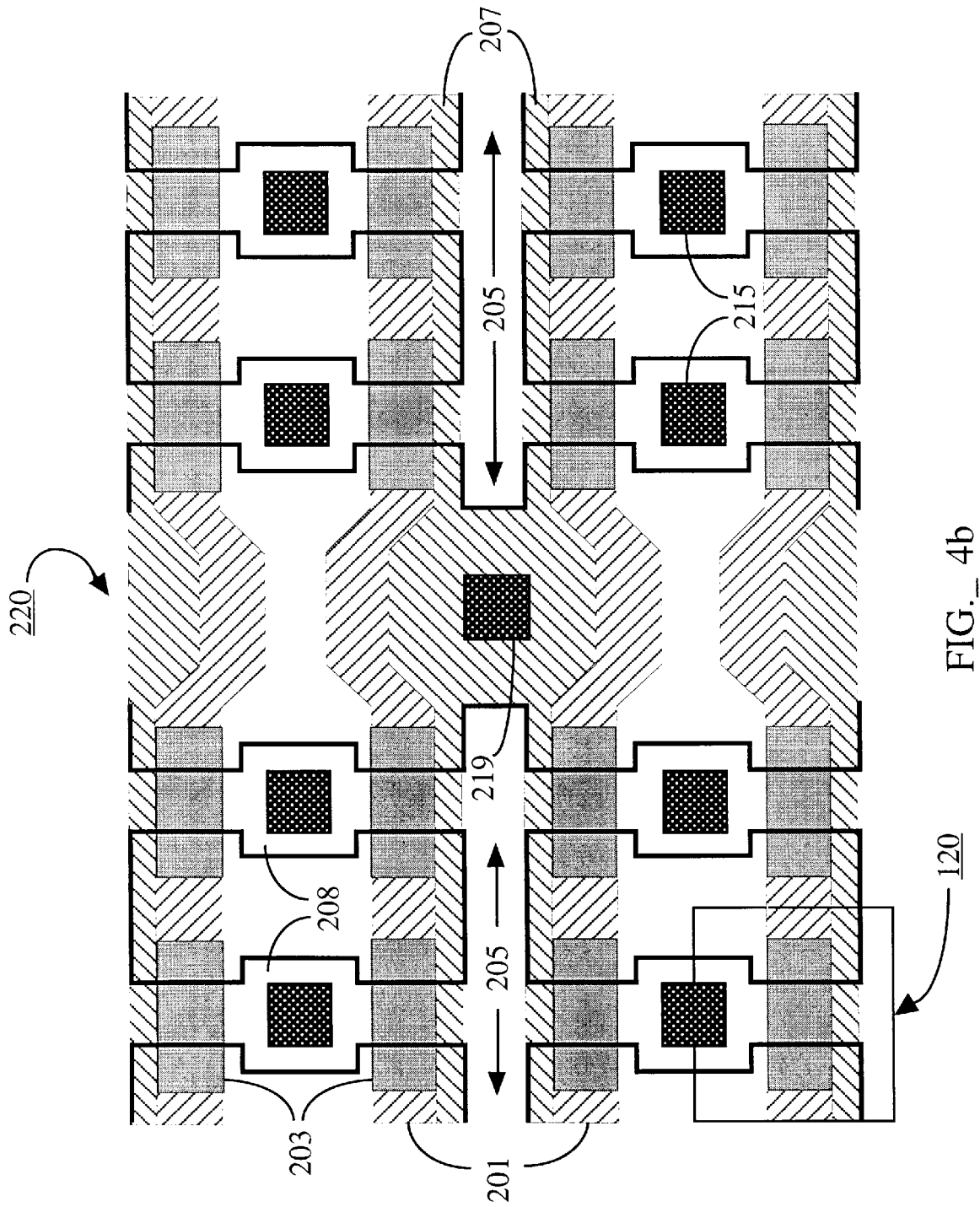
FIG._4b

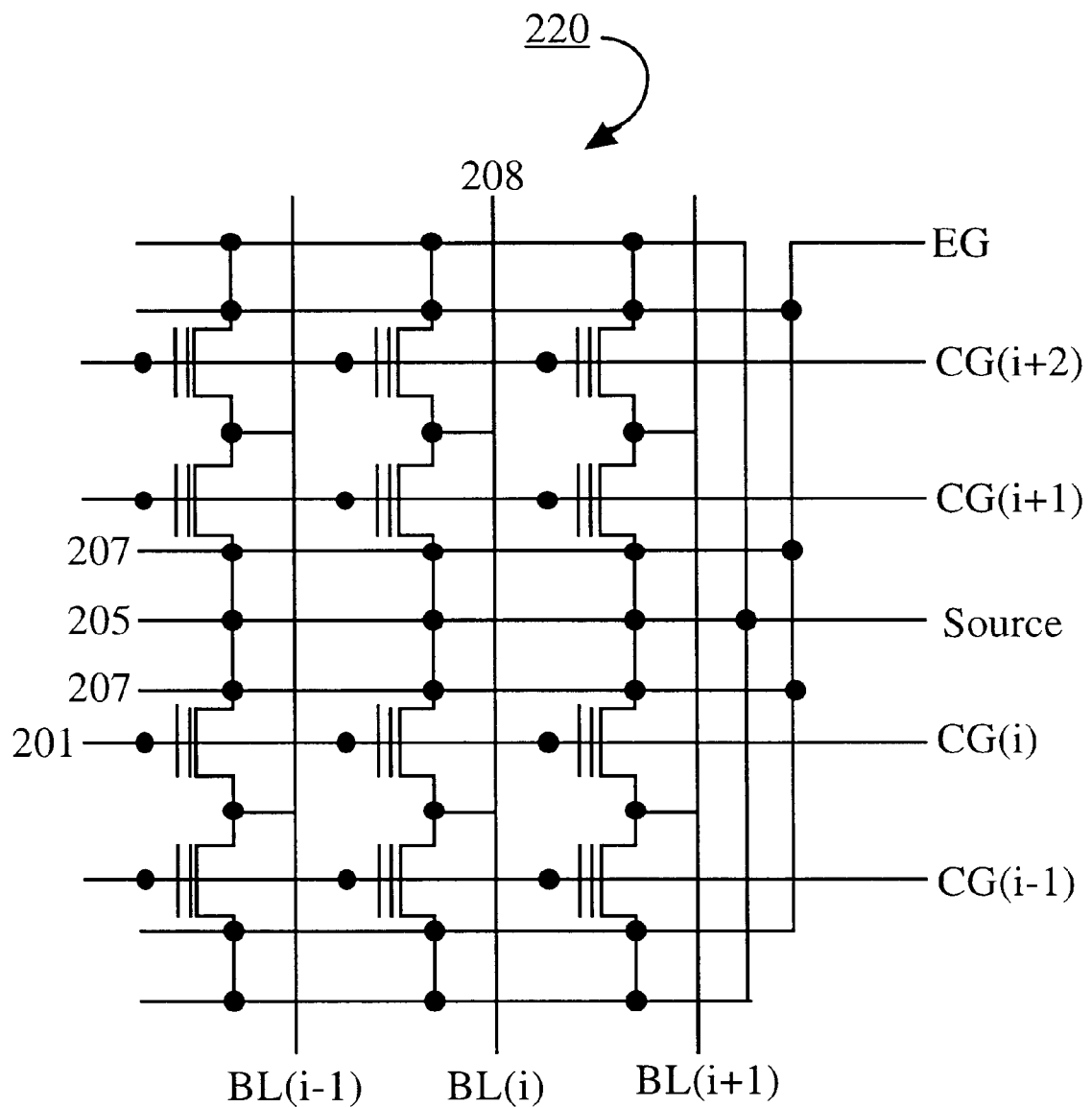
FIG._ 5

METHOD OF FORMING A FLASH EEPROM DEVICE BY EMPLOYING POLYSILICON SIDEWALL SPACER AS AN ERASE GATE

This application is a division of Ser. No. 09/060,673, Filed Apr. 15, 1998 now U.S. Pat. No. 6,043,530.

BACKGROUND OF THE INVENTION

1. Field of the Invention

The present invention relates to a memory device and, in particular, to a source-side-injection Electrically Erasable Programmable Read Only Memory (EEPROM) device based on a Flash cell which employs a sidewall polysilicon spacer as an Erase Gate (EG).

2. Discussion of the Prior Art

In order to realize a Flash EEPROM array having a density of 16 Mbits or higher, technology innovations in both memory cell structure and array architecture are required. In the past, Intel's well-know "T-shaped" ETOX cell has been intensively utilized in Flash memory applications because of its small cell size and simple stack gate structure. Examples of such devices are described by Jinbo et al., "A 5V-Only 16 Mb Flash Memory with Sector Erase Mode", IEEE JSSC, P. 1547, 1992 and by Atsumi et al., "A 16 Mb Flash EEPROM with a New Self-Data-Refresh Scheme for a Sector Erase Operation", IEEE JSSC, P. 461, 1994. However, the conventional operation issues, such as high programming current and high erase band-to-band tunneling current place severe limitations on the power supply ($V_{cc}$) scalability and cell size scalability. In fact, band-to-band tunneling current limits $V_{cc}$ scaling in an ETOX memory array with a large sector size (i.e. 512K bits per sector) architecture. Furthermore, band-to-band tunneling current limits cell size scaling because a source junction as deep as 0.2 um is required for a 0.35 um technology. That means source lateral diffusion takes more than one third of the transistor channel length and cell scalability is severely limited.

Source side injection Flash memory cells using a polysilicon sidewall spacer as a select gate are introduced to address the high programming current issue associated with the ETOX cell. Examples of such devices are described by Wu et al., "Electrically Programmable Memory Device Employing Source Side Injection", U.S. Pat. No. 4,794,565, 1988 and by Naruke et al., "A New Flash-Erase EEPROM Cell with a Sidewall Select-Gate on its Source Side", IEEE IEDM, P. 603, 1989. However, an individual polysilicon-sidewall-spacer line has to be strapped with a metal line in order to be switched as a word line during a read cycle and thus, memory array layout becomes metal pitch limited. Furthermore, the issue of high band-to-band tunneling current during erase was not addressed.

Jeng et al., "Single Transistor Non-volatile Electrically Alterable Semiconductor Memory Device with a Re-crystallized Floating Gate", U.S. Pat. No. 5,067,108, 1991, proposed a source-side-injection Flash cell with a non-self-aligned select transistor. This cell is erased by a poly-to-poly tunneling mechanism and thus, band-to-band tunneling current is eliminated. With this approach, an independent select transistor with a silicide gate is used to replace the sidewall spacer select transistor and thus, metal strapping is not necessary. However, this cell has two transistors in series plus a source coupling region and thus, cell size is inherently large. Furthermore, the select gate channel length is alignment sensitive and the source junction has to sustain a high voltage, both of which undesirably limit further cell scaling.

Yuan et al. disclosed two U.S. Pat. Nos. 5,712,179 and 5,534,456 describing new EEPROM devices based on a split gate flash cell in a contactless virtual ground array. By eliminating metal contacts within memory cells, a compact flash memory array can be achieved. However, continuous source/drain bit lines introduce high bit line diffusion capacitance as well as high bit-line/word-line overlap capacitance and thus, slow down the memory access speed. Furthermore, the high programming current (>300 uA/cell) associated with the ETOX-type programming mechanism, limits cell's Vcc scalability. Consequently, although Yuan's memory arrays are suitable for low speed, high density applications such as compact flash cards, they are not designed for the high speed, low Vcc, low power applications targeted in the present invention.

SUMMARY OF THE INVENTION

It is therefore the object of this invention to provide a memory device based on a compact Flash cell and memory array requiring low currents for both program and erase operations, and thus, the device is suitable for low $V_{cc}$, low power, high density Flash memory applications.

The inventive cell has a control gate overlapping a sized-up floating gate (by "sized-up", it is meant that the length of the floating gate is longer than the length of the control gate) to form a stack gate. The stack gate is side by side with a sidewall spacer erase gate with a thin poly tunnel oxide between the erase gate and the floating gate, with a thicker dielectric layer between the erase gate and the control gate. The preferred cell is built on a P-type semiconductor substrate with self-aligned N-type source and drain regions. This cell is programmed by channel hot electron injection at the source side of the floating gate transistor and erased by poly-to-poly tunneling through the poly tunnel oxide. Since the poly tunnel oxide thickness is minimized, a high lateral field (at the injection point) and a fast programming speed can be obtained. In addition, cell programming current is limited to less than 1 uA which enables the memory array based on this cell to be programmed in a page mode. Therefore, high speed programming with low power consumption can be achieved. By using a poly-to-poly erase scheme, band-to-band tunneling current during erase is advantageously eliminated. Therefore, a deep source junction is not used and cell size can be significantly reduced. Furthermore, a large sector of cells can be erased simultaneously without a power consumption concern and further $V_{cc}$ scaling becomes possible. Since both program and erase power consumption are low, the inventive cell is suitable for low $V_{cc}$, low power applications.

Based on the inventive cell, a NOR-type Flash EEPROM array is organized with bit lines running in the vertical direction while control gate word lines, source lines and erase gate lines run in the horizontal direction. This array is divided into sectors in which cell data can be altered by sector erase followed by page write.

This array is fabricated with a triple polysilicon process in which the sized-up floating gate poly is defined by the control gate sidewall dielectric spacer in a self-aligned etch process. After stack gate formation, a poly tunnel oxide is grown before forming the poly sidewall spacer erase gate. Since a deep N-well and a deep source junction are not used, the process complexity is comparable to that of the ETOX architecture. By reducing the depth of the source junction, this cell size is comparable to the ETOX cell.

In another embodiment of the invention, bit line parasitic capacitance in high speed applications is addressed. Namely, since the erase gate is conductive during a normal read operation, the erase gate channel introduces an additional gate capacitance component to the bit line capacitance. In order to minimize the bit line capacitance, an alternative cell design with the sidewall spacer erase gate on the source side of the stack gate is introduced for high speed applications.

A better understanding of the features and advantages of the present invention will be obtained by reference to the following description of the preferred embodiments and accompanying description of the drawings and tables.

DESCRIPTION OF THE DRAWINGS

FIG. 1b is a cell schematic which shows the cell terminals of FIG. 1a;

FIG. 1e is a sectional view illustrating another alternative cell which employs an independent non-self-aligned select transistor as an erase gate as well as a select gate;

FIG. 2a is a layout around the source line contact of an array based on the cell of FIG. 1a;

FIG. 2b is a layout around the erase gate contacts of the array based on the cell of FIG. 1a;

FIG. 3 is a schematic of the memory array based on the cell of FIG. 1a;

FIG. 4a is a layout around the source line contact of an array based on the cell of FIG. 1c;

FIG. 4b is a layout around the erase gate contact of the array based on the cell of FIG. 1c;

FIG. 5 is a schematic of the memory array based on the cell of FIG. 1c; and

DESCRIPTION OF THE PREFERRED EMBODIMENTS

In keeping with the objects of this invention, a more detailed description is given for the inventive cells, Flash EEPROM arrays based on these cells and their fabrication processes.

Figure 1A:
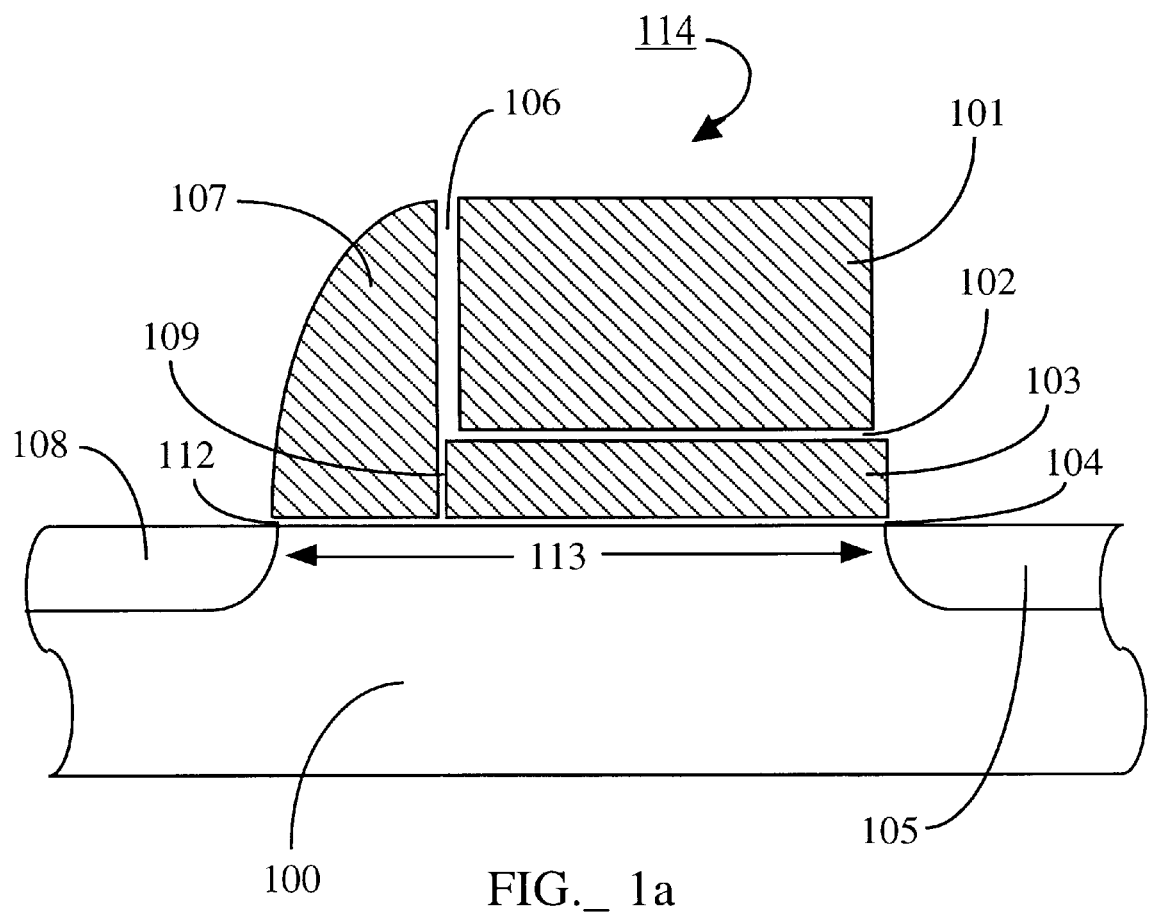
FIG. 1a is a sectional view illustrating a source side injection cell which employs a sidewall polysilicon spacer on the drain side as an erase gate.

FIG. 1a is a sectional view of an inventive cell 114. A semiconductor substrate 100 of a first conductivity type (P-type) has a source region 105 and a drain region 108 of opposite conductivity type (i.e. both N-type) formed therein. Extending between the source region 105 and the drain region 108 is an active channel region 113. A floating gate (FG) 103 is surmounted by and sized-up from a control gate (CG) 101 to form a stack gate with a layer 102 of oxide/nitride/oxide (ONO) in between. Between the floating gate 103 and the substrate 100 is a floating gate oxide layer 104.

Figure 1B:
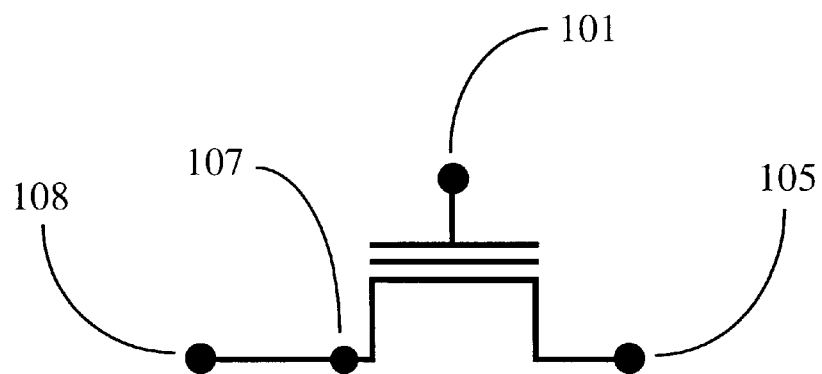

Positioned above channel region 113 and to the side of stack gate 101, 103 is a polysilicon spacer 107 which is used as an erase gate (EG). A layer 106 between the control gate 101 and the erase gate 107 is a dielectric layer which has to be thick enough to prevent any leakage current therebetween. A poly tunnel oxide layer 109, through which cell erase tunneling takes place, is formed between the floating gate 103 and the erase gate 107. An erase gate oxide 112 is formed between the erase gate 107 and the channel region 113. Floating gate 103 and erase gate 107 are fabricated from polysilicon material while control gate 101 comprises polysilicon and tungsten silicide (WSi) materials to minimize the word line resistance. FIG. 1b is a cell schematic which lists cell terminals, namely control gate 101, drain 108, source 105 and erase gate 107.

Cell 114 is programmed by a well known source-side channel-hot-electron-injection mechanism to reach a high threshold voltage ($V_{th}$) state (higher than $V_{cc}$). To program cell 114, control gate 101 is biased at $V_{pp}$ (around 10V), erase gate 107 is biased around its threshold voltage, source 105 is biased at $V_{src}$ (around 4.5V) while drain 108 is biased near 0V. Under such bias conditions, channel hot electrons are generated within the erase-gate depletion region and injected onto floating gate 103 due to the presence of a high control gate bias. Since the thickness of poly tunnel oxide 109 (around 150 Å) is minimized, a high lateral field is achieved within the erase gate depletion region and a fast programming speed can be obtained. In addition, cell programming current is determined by the erase gate bias which can be limited to 1 uA or less. Such a low current programming scheme enables an array 214 (see FIG. 2a) based on cell 114 to be programmed in page mode; that is to program one row of cells 114 at a time. Therefore, high speed programming with low power consumption can be achieved.

Cell 114 is erased by poly-to-poly tunneling through poly tunnel oxide layer 109. To erase cell 114, erase gate 107 is biased at $V_{pe}$ (around 10V), drain 108 is biased at an intermediate voltage (around $V_{cc}$) while control gate 101 is grounded and source 105 is left floating. Under such bias conditions, electrons tunnel through poly tunnel oxide 109 and cell 114 is shifted towards a low threshold voltage state. The drain voltage is provided to reduce the field across erase gate oxide 112. Dielectric layer 106 between erase gate 107 and control gate 101 has to be thick enough (around 300 Å) to eliminate leakage current therebetween. By using the poly-to-poly erase scheme, band-to-band tunneling current during erase is eliminated. Without the band-to-band tunneling current concern, a deep source junction is not used and cell size can be significantly reduced. Furthermore, a large sector of cells 114 can be erased simultaneously without a power consumption concern. In contradistinction to the invention, band-to-band tunneling current limits $V_{cc}$ scaling in the ETOX architecture with a large sector size (i.e. 512K bits per sector). In the present invention, using the poly-to-poly erase mechanism, cell 114 provides a solution for further $V_{cc}$ scaling, without compromising the sector size.

Because erase gate 107 is always conducting during the read operation, cell 114 shares the same over-erase issue as the conventional ETOX cell. To address this issue, a reverse programming scheme after an erase operation is used to shift the cell threshold voltage to a positive value. The bias condition of reverse programming in the inventive cell 114 is the same as that of normal programming except that control gate is biased at $V_{pr}$ which is around 7V. After reverse programming, a narrow cell threshold voltage distribution with a controllable mean value (around 0.5V) can be obtained and the over-erase issue can be solved.

Cell 114 is read by biasing control gate 101 at $V_{cc}$ (or a higher voltage for the pumped word line design), erase gate 107 around $V_{cc}$ and drain 108 around 1V while source 105 is grounded. The erase gate voltage needs to be high enough so that it won't limit cell read current, provided that there is no floating gate charge loss. The drain bias voltage is determined by the erase gate bias as well as the cell soft write characteristics. Since the spacing between erase gate 107 and floating gate 103 is minimized, there is no discontinuity within the conducting channel 113 and a high cell read current can be obtained.

Figure 1C:
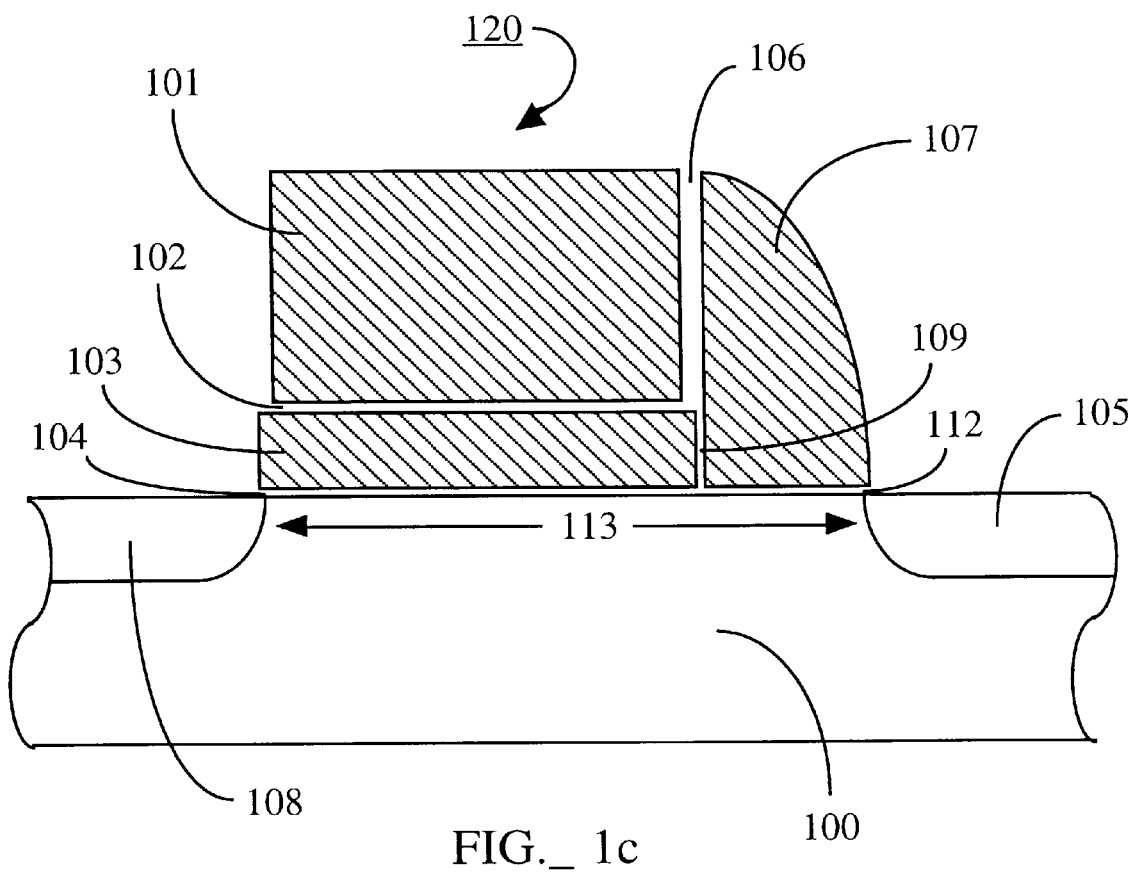
FIG. 1c is a sectional view illustrating an alternative cell which employs a sidewall polysilicon spacer on the source side as an erase gate.
Figure 1D:
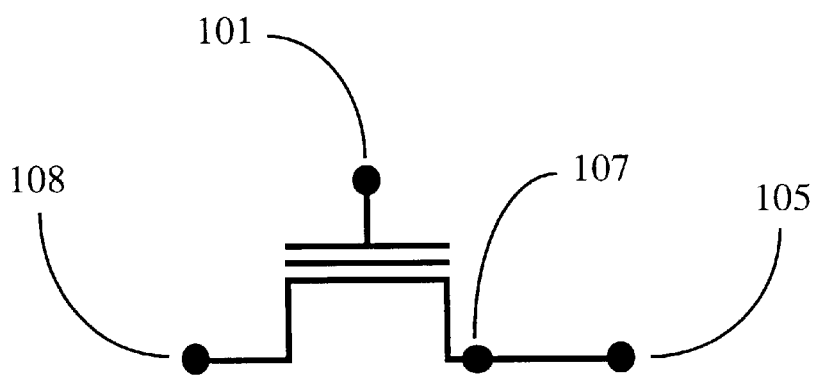
FIG. 1d is a cell schematic which shows the cell terminals of FIG. 1c.

By moving the sidewall spacer erase gate 107 from the drain side to the source side, an alternative cell 120 can be obtained as shown in FIG. 1c. It should be understood that either cell 114 or cell 120 might be preferred for a given application. The operation of cell 120 is the same as that of cell 114 except that source and drain biases are transposed during both the erase and the program operations (compare Table 1 and Table 2 located immediately before the claims). To program cell 120, drain 108 is biased at a voltage around 4.5V while source 105 is grounded. To erase cell 120, source 105 is biased at a voltage around $V_{cc}$ while drain 108 is left floating. Since channel high voltage (which is around 4.5V) is applied to drain 108, cell 120 can be programmed only in a byte mode. Referring to FIG. 4a, although cell 120 cannot be programmed in a page mode, this cell 120 does offer the following advantages: (1) erase gate 107 is at the source side and the bit line capacitance is reduced; (2) erase gate lines 207 and source lines 205 (both horizontal-running) can be respectively connected with the first metal layer (metal 1) lines (not shown for clarity of illustration) which run in the vertical direction. Thus, A bit line segmentation scheme can be implemented with the second metal (metal 2) main bit line running in the vertical direction to further reduce the bit line capacitance.

Another alternative cell 121 which is similar to cell 114, is shown in FIG. 1e. In this cell, the polysilicon sidewall spacer erase gate (e.g. see reference numeral 107 of FIG. 1a) is replaced by an independent non-self-aligned select gate 122 which functions as an erase gate as well as a select gate. Since the select gate 122 is switched as a word line during read, this cell 121 cannot be over-erased even if the threshold voltage of the floating gate transistor is negative. Therefore, reverse programming is not required. It should be understood that this alternative to the preferred embodiments of the invention described herein can be employed in practicing the invention.

A NOR-type memory array 214 implemented with a plurality of cells 114, is shown in FIG. 2a. This layout is near a source contact 216. A similar layout around erase gate contacts 219 is shown in FIG. 2b. As seen in FIG. 2a, control gate word lines 201, diffusion source lines 205 and erase gate polysilicon lines 207 run in the horizontal direction and drain bit lines 208 run in the vertical direction. Also shown in FIG. 2a are field oxide 210 and drain bit line contacts 215 while metal lines are not included for clarity. In this architecture, vertically-running metal 1 lines strap bit lines 208 while horizontally-running metal 2 lines strap source lines 205 and erase gate lines 207. In order to reduce the capacitance associated with bit lines 208, a bit line segmentation scheme can be implemented by running metal 3 main bit lines in the vertical direction.

In this architecture, memory sector size is quite flexible and can be as small as two rows of cells. For a typical Flash memory architecture with 512K bits per sector, one sector can cover 512 rows of cells. Erase gate lines 207 of an entire sector can be tied together to simplify the decoding. On the other hand, erase gate lines 207 could be further decoded to small blocks to reduce the charging and discharging current during switching between program and program verify operations. Since two neighboring rows of cells 114 (which share a row of drain contacts 215) always belong to the same sector, the neighboring erase gate lines 207 can be connected together. Therefore, two neighboring erase gate lines 207 share one metal 2 line and cell layout is not metal 2 pitch-limited. Combining a small cell size with a non-metal-pitch-limited array, the array size is significantly smaller compared with existing memory arrays based on existing source side injection cells and thus, this array 214 is suitable for high density Flash EEPROM applications.

FIG. 3 is a schematic of array 214 in accordance with the array layouts shown in FIG. 2a and FIG. 2b. Table 1 lists array operation conditions in which the CG(i) page 201 (one row worth of cells) is selected during program; the particular cell 114 located at the intersection of the control gate line CG(i) 201 and the bit line BL(i) 208 is selected for read; the erasing sector covers all of the cells 114 shown in the figure and the reverse programming is carried out one row of cells 114 at a time.

Due to a low cell programming current, this array 214 can be programmed in a page mode as well as in a byte mode. During a page program operation, an entire row of cells 114 are programmed simultaneously according to data presented at individual bit lines 208. When a "0" data is to be programmed into a given cell 114, the specific bit line 208 is biased at around 0V and hot electron injection occurs. If the input data is a "1", the specific bit line 208 is biased at $V_{cc}$ and hot electron injection cannot occur; nor can the electron tunneling because of a 4.5V source bias. Thus, the specific cell 114 remains in the erase state. For a very low $V_{cc}$ application (i.e. $V_{cc}$=2V or lower), a page can be further divided into several sections and a program operation can be carried out one section at a time to reduce the source current and thus, the charge pump size. For such a design, bit lines 208 of those unselected sections are biased at $V_{cc}$ to prevent any program disturb.

During a sector erase operation, an entire sector of cells 114 is erased simultaneously. Since poly-to-poly tunneling is used for the erase, the DC component of erase current is virtually zero. A bit line bias of $V_{cc}$ minimizes the erase gate to bit line leakage. With this design, the thickness of erase gate oxide 112 can be thinner and the erase gate channel length can be shorter which improves cell scalability. During erase, bit line charging current can be reduced when the bit line segmentation scheme is implemented.

The other NOR-type memory array 220 implemented with the cell 120 is shown in FIG. 4a. This layout is near a source contact 216. A similar layout around an erase gate contact 219 is shown in FIG. 4b. As seen in FIG. 4a, control gate word lines 201, diffusion source lines 205 and erase gate polysilicon lines 207 run in the horizontal direction and drain bit lines 208 run in the vertical direction. Also shown in FIG. 4a are field oxide 210 and drain bit line contacts 215 while metal lines are not included for clarity of illustration.

In this architecture, both source 105 and erase gate 107 of a cell 120 are respectively connected to sources 105 and erase gates 107 of all other cells 120 of the same sector. Within a sector, metal 1 lines running in the vertical direction are used not only to strap local bit lines 208 but also to connect diffusion source lines 205 and polysilicon erase gate lines 207. Thus, metal 2 lines which also run in the vertical direction, can be set aside for strapping main bit lines (not shown for clarity) to implement bit line segmentation.

FIG. 5 is an array 220 schematic in accordance with the array 220 layouts shown in FIG. 4a and FIG. 4b. Table 2 lists array operation conditions in which cell 120 located at intersection of the control gate line CG(i) 201 and the bit line BL(i) 208 is selected for read, program and reverse program operations. All cells 120 of an entire sector are erased simultaneously (note that all cells 120 in FIG. 5 belong to one sector). Since cell sources 105 of an entire sector are connected together, this array 220 can be programmed only in a byte mode. However, a lower bit line capacitance improves memory access speed and makes this architecture superior for high speed applications. Furthermore, low power consumption for both program and erase operations, which is inherent to the cell 120, makes this architecture suitable for low $V_{cc}$, low power and high speed applications.

Figure 6A:
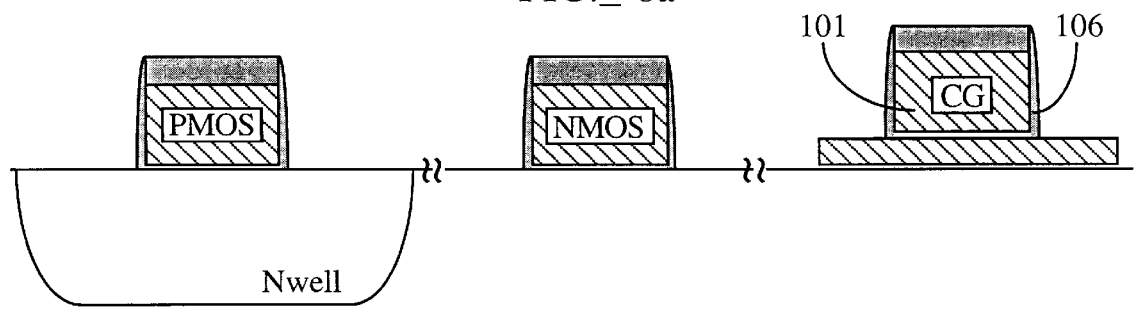
FIGS. 6a, 6b, 6c and 6d are sectional views of an array cell and peripheral transistors during a variety of process steps.
Figure 6B:
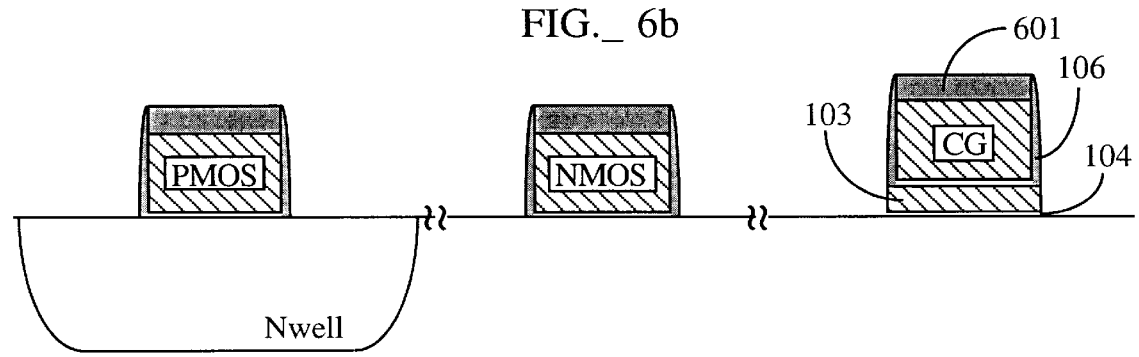
Figure 6C:
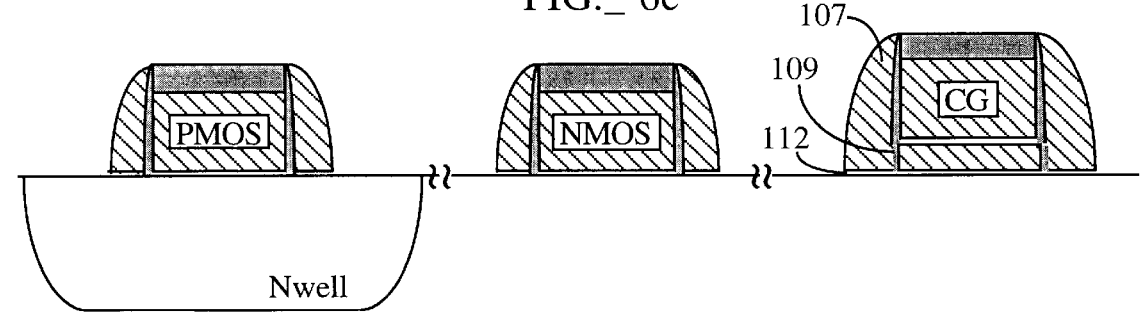
Figure 6D:
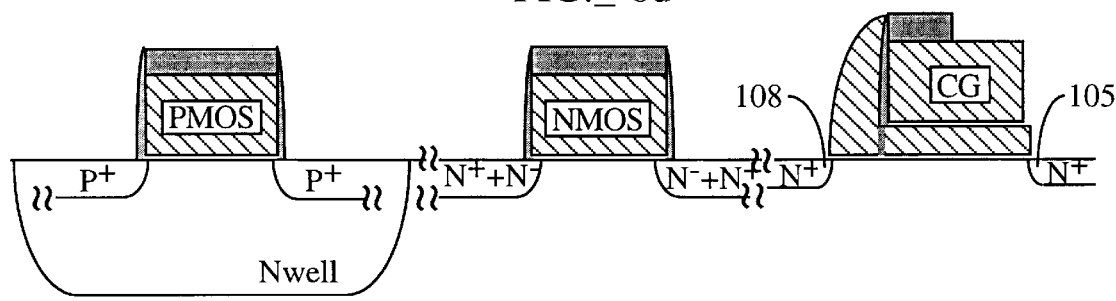

The fabrication process of the cell 114 is similar to that of a conventional ETOX cell up to the second poly etch step. After etching the second poly, process steps include:

1) forming a dielectric spacer 106 on the sidewall of the second poly with the spacer thickness between 350 Å and 650 Å (FIG. 6a);

2) etching the floating gate poly 103 using the oxide cap 601 and the dielectric spacer 106 as hard masks (FIG. 6b; note that the sized-up floating gate 103 is defined by control gate spacer 106);

3) implanting Boron to shift the erase gate threshold voltage to around 1V;

4) stripping the exposed floating gate oxide layer 104 on the silicon surface (FIG. 6b);

5) growing an erase gate oxide 112 with thickness between 50 Å and 250 Å (FIG. 6c);

6) growing a poly tunnel oxide 109 on the sidewall of the floating gate poly during step (5) (FIG. 6c);

7) depositing and etching back erase gate poly (poly 3) to form a polysilicon sidewall spacer 107 with thickness between 0.1 um and 0.3 um (FIG. 6c);

8) forming poly 3 contact pads with a photolithography mask during step (7);

9) stripping poly 3 spacer at the source side of the cell with a photolithography mask;

10) etching the field oxide along the source lines using control gate poly and floating gate poly as hard masks;

11) implanting $N^+$ Arsenic for peripheral NMOS transistors as well as array cells;

12) stripping poly 3 spacer of peripheral transistors followed by an N– implant;

13) implanting $P^+$ Boron for the peripheral PMOS transistors (FIG. 6d).

Since deep N-well and deep source junction are not used, the process complexity of cell 114 is comparable to that of the ETOX cell. By reducing the depth of the source junction, this cell 114 is comparable in size to the ETOX cell.

The fabrication process of cell 120 is similar to that of the cell 114 except that erase gate polysilicon is used as a hard mask for etching the field oxide 210 at the source side during step (10). In addition, one additional mask is needed to remove the poly 3 sidewall spacer on the drain side of the cell 120 before implanting the $N^+$ Arsenic at step (11).

It should be understood that various alternatives to the embodiments of the invention described herein may be employed in practicing the invention. It is intended that the following claims define the scope of the invention and that methods and structures within the scope of these claims and their equivalent be covered thereby.

Table 1 lists operation conditions for the array based on the cell of FIG. *a*; and Table 2 lists operation conditions for the array based on the cell of FIG. 1c.

TABLE 1

|  | Program | Read | Erase | Reverse_pgm |
|---|---|---|---|---|
| CG(i + 2) | 0V | 0V | 0V | 0V |
| CG(i + 1) | 0V | 0V | 0V | 0V |
| CG(i) | $V_{pp}$ note 1 | $V_{cc}$ note5 | 0V | $V_{pr}$ note10 |
| CG(i − 1) | 0V | 0V | 0V | 0V |
| Source(m + 1) | floating | floating | floating | floating |
| Source(m) | $V_{src}$ note2 | 0V | floating | $V_{src}$ |
| EG(m + 1) | $V_{th}$ note3 | $V_{cc}$ note6 | $V_{pe}$ note8 | $V_{th}$ |
| EG(m) | $V_{th}$ | $V_{cc}$ | $V_{pe}$ | $V_{th}$ |
| EG(m − 1) | $V_{th}$ | $V_{cc}$ | $V_{pe}$ | $V_{th}$ |
| BL(i + 1) | data note4 | floating | $V_{bd}$ note9 | 0V note11 |
| BL(i) | data | $V_{bl}$ note7 | $V_{bd}$ | 0V |
| BL(i − 1) | data | floating | $V_{bd}$ | 0V | note1: $V_{pp}$ is around 10V which is determined by the program target $V_{th}$.
note2: $V_{src}$ is around 4.5V.
note3: Erase gate threshold voltage is around 1V.
note4: Input data; around $V_{cc}$ when data = "1", around 0V when data = "0".
note5: CG voltage is higher than $V_{cc}$ for the pumped word line design.
note6: EG is biased at $V_{cc}$ if the data retention is not an issue.
note7: Bit line bias is around 1V driven by the sense amplifier.
note8: $V_{pe}$ is around 10V which is determined by the erase target Vth.
note9: $V_{bd}$ is the bit line de-bias voltage which is between 0V and 5V.
note10: $V_{pr}$ is the reverse program voltage which is around 7V.
note11: This voltage can be higher than 0V to eliminate EG leakage current.

TABLE 2

|  | Program | Read | Erase | Reverse_pgm |
|---|---|---|---|---|
| CG(i + 2) | 0V | 0V | 0V | 0V |
| CG(i + 1) | 0V | 0V | 0V | 0V |
| CG(i) | $V_{pp}$ note 1 | $V_{cc}$ note4 | 0V | $V_{pr}$ note8 |
| CG(i − 1) | 0V | 0V | 0V | 0V |
| Source | 0V | 0V | $V_{sd}$ note6 | 0V |
| EG | $V_{eg}$ note2 | $V_{cc}$ | $V_{pe}$ note7 | $V_{eg}$ |
| BL(i + 1) | floating | floating | floating | floating |
| BL(i) | $V_{bp}$ note3 | $V_{br}$ note5 | floating | $V_{bp}$ |
| BL(i − 1) | floating | floating | floating | floating | note1: $V_{pp}$ is around 10V which is determined by the program target $V_{th}$.
note2: $V_{eg}$ is about 0.5V higher than the erase gate threshold voltage.
note3: $V_{bp}$ is around 4.5V for data = "0" and 0V for data = "1".
note4: CG voltage is higher than $V_{cc}$ for the pumped word line design.
note5: Bit line bias is around 1V driven by the sense amplifier.
note6: $V_{sd}$ is the source de-bias voltage which is between 0V and 5V.
note7: $V_{pe}$ is around 10V which is determined by the erase target $V_{th}$.
note8: $V_{pr}$ is the reverse program voltage which is around 7V.

What is claimed is:

1. A method of fabricating a Flash EEPROM device having an array of cells, the method comprising:

1) providing peripheral PMOS and NMOS transistors and a flash EEPROM device on a silicon substrate, wherein said providing a flash EEPROM device comprises:
   providing a partially processed semiconductor wafer including a floating gate oxide on a substrate, a first polysilicon layer disposed on the floating gate oxide, a second polysilicon layer disposed thereon with an interpolysilicon dielectric layer therebetween, and an oxide cap on top of the second polysilicon layer;

2) patterning and etching the oxide cap and the second polysilicon layer so that a portion of the second polysilicon layer form a control gate structure presenting sidewalls;

3) forming dielectric spacers on the sidewalls of the control gate structure, on peripheral PMOS and NMOS transistors, the dielectric spacers having a thickness ranging between 350 Å and 650 Å;

4) etching the first polysilicon layer so that a portion of the first polysilicon layer form a floating gate structure, using the oxide cap and the dielectric spacers as hard masks for the etching;

5) implanting Boron to a sufficient concentration to shift an erase gate threshold voltage to around 1V;

6) stripping a portion of the floating gate oxide on the silicon substrate;

7) growing an erase gate oxide with thickness between 50 Å and 250 Å;

8) growing a poly tunnel oxide on sidewalls of the floating gate structure during step (7);

9) depositing and etching back an erase-gate polysilicon layer to form polysilicon sidewall spacers on said flash EEPROM device, said peripheral PMOS and NMOS transistors, wherein said polysilicon sidewall spacers having a thickness between 0.1 um and 0.3 um;

10) forming polysilicon contact pads with a photolithography mask during step (9);

11) stripping selected portions of the layer polysilicon sidewall spacers on one side of the flash EEPROM device, using a photolithography mask;

12) etching a field oxide along source lines;

13) implanting $N^+$ Arsenic for the peripheral NMOS transistor as well as array cells;

14) stripping the polysilicon sidewall spacers of peripheral PMOS and NMOS transistors followed by an $N^-$ implant; and 15) implanting $P^+$ Boron for the peripheral PMOS transistor.

* * * * *